United States Patent [19]
Peters et al.

[11] Patent Number: 5,517,170
[45] Date of Patent: May 14, 1996

[54] MULTILAYER THIN FILM HALL EFFECT DEVICE

[75] Inventors: Palmer N. Peters, Huntsville; Robert C. Sisk, Madison, both of Ala.

[73] Assignee: The United States of America as represented by the Administator of the National Aeronautics and Space Administration, Washington, D.C.

[21] Appl. No.: 317,071

[22] Filed: Sep. 30, 1994

[51] Int. Cl.$^6$ .................................. H01L 43/00
[52] U.S. Cl. .......................................... 338/32 H
[58] Field of Search .................. 338/32 H, 32 R; 324/117 H, 207.2

[56] References Cited

U.S. PATENT DOCUMENTS

| | | | |
|---|---|---|---|
| 4,584,552 | 4/1986 | Suzuki et al. | 338/32 H |
| 4,823,075 | 4/1989 | Alley | 324/117 H |
| 4,905,318 | 2/1990 | Fukuda et al. | 338/32 H |
| 5,055,820 | 10/1991 | Kimura et al. | 338/32 H |
| 5,146,201 | 9/1992 | Kimura et al. | 338/32 H |

*Primary Examiner*—Marvin M. Lateef
*Attorney, Agent, or Firm*—Robert L. Broad, Jr.

[57] ABSTRACT

A Hall effect device and a method of obtaining a magnetic field map of a magnetic body with the Hall effect device. The device comprises: (1) a substrate, (2) a first layer having a first Hall coefficient deposited over the substrate and (3) a second layer having a second Hall coefficient deposited over the first layer, the first and second layers cooperating to create, in the Hall effect device, a third Hall coefficient different from the first and second Hall coefficients. Creation of the third Hall coefficient by cooperation of the first and second layers allows use of materials for the first and second layers that were previously unavailable for Hall effect devices due to their relatively weak Hall coefficient.

20 Claims, 2 Drawing Sheets

MULTILAYER THIN FILM HALL EFFECT DEVICE

ORIGIN OF THE INVENTION

This invention was made by an employee of the United States Government and may be manufactured and used by or for the Government for governmental purposes without the payment of any royalties.

BACKGROUND OF THE INVENTION

Field of the Invention

The present invention is directed, in general, to Hall effect devices and, more particularly, to such devices constructed of multiple thin film layers, for, among other things, cryogenic magnetic field mapping.

DESCRIPTION OF RELATED ARTS

Hall effect devices, in general, have been in existence for many years. When a current flows in a conductor in the presence of a magnetic field, a force $(q/c)v \times B$ acts directly on the moving charge carriers. The charge carriers react to this force by moving as a function of the field, collecting on one side of the conductor and creating a voltage difference from one side of the conductor to another.

This effect was discovered in 1879 by E. H. Hall, studying at Johns Hopkins. In those days no one understood the mechanism of conduction in metals; the electron itself was unknown. The Hall effect proved to be a most instructive phenomenon. For modern research on electric conduction and magnetic field properties, especially in semiconductors, Hall effect measurements are indispensable.

For instance, it is important to understand the magnetic field properties of certain magnetic bodies, particularly at cryogenic temperatures. These bodies are imbued with a permanent magnetic field during manufacture. However, due to imperfections in the manufacture of the body and in its magnetization, anomalies of strength in the body's magnetic field may be present. A quantified understanding of the magnetic field produced by the magnetic body is critical in gauging the body's suitability for a particular purpose. Ideally, this understanding is obtained by creating a magnetic map of the component. A magnetic map is best created by moving the magnetic body past an array of closely-spaced Hall effect devices, all performed under cryogenic conditions. The voltage differences across the Hall effect devices are measured to determine magnetic field strength.

Many prior art Hall effect devices comprise a semiconductor body to which leads are attached, thereby forming a sensor component. This component is attachable by rather conventional means to a circuit board or other mounting surface. Such components have been suitable for cryogenic applications. However, it has proven difficult to mount the Hall effect component to circuit boards and the like because of stress due to the extreme changes in temperature brought about by cooling the component and the board to such cryogenic temperatures.

This mounting difficulty becomes extremely difficult when it is necessary to mount multiple Hall effect components in very close proximity to form an array for cryogenic magnetic mapping, as described above.

One solution to the above problem is to dispense with separate semiconductor components and to deposit a thin film of a material that displays a suitably high Hall coefficient directly on a substrate. However, to this day, the only known materials suitable for conventional thin film deposition techniques (such as sputtering) that also exhibit a sufficient Hall coefficient are bismuth and some recently discovered high $T_c$ superconductors that have naturally layered structures (see, Chaban, *Transport of High-Temperature Superconductors in the Normal State*, Journal of Superconductivity, vol. 6, no. 6, December, 1993).

Bismuth suffers from two notable disadvantages. First, similar to lead, it is somewhat toxic, requiring careful handling and manufacturing techniques to avoid adverse health effects. Second, while bismuth displays a suitable Hall coefficient, its Hall coefficient is not adjustable. Because voltages across the Hall effect devices vary as a function of, among other things, the Hall coefficient of the devices, it is advantageous to be able to adjust the Hall coefficient to yield a device that has been tuned for a particular application. With prior art bismuth thin film Hall effect devices, one was not availed of that option. While some high $T_c$ materials exhibit variable Hall effects, the naturally-fixed spacings of the layers of the materials do not permit a wide range of adjustment in layer separation.

Accordingly, what is needed in the art is a thin film Hall effect device that eliminates a need for use of toxic bismuth and that can be manufactured to have a desired Hall coefficient, allowing each device to be tuned to a desired sensitivity and response.

SUMMARY OF THE INVENTION

It is therefore a primary object of the present invention to provide a thin film Hall effect device that allows use of materials as alternatives to bismuth. It is a further primary object of the present invention to provide a Hall effect device that has a selectable Hall coefficient, thereby creating a family of thin film Hall effect devices that can be configured for a desired sensitivity or response.

Accordingly, to address the above-noted primary object, the present invention provides a Hall effect device and a method of obtaining a magnetic field map of a magnetic body with the Hall effect device. The device comprises: (1) a substrate, (2) a first layer having a first Hall coefficient deposited over the substrate and (3) a second layer having a second Hall coefficient deposited over the first layer, the first and second layers cooperating to create, in the Hall effect device, a third Hall coefficient different from the first and second Hall coefficients.

The present invention is the first to deposit a duality of materials in thin films, one over the other, to produce a thin film Hall effect device having a tunable Hall coefficient (the "third Hall coefficient"). Creation of the third Hall coefficient by cooperation of the first and second layers allows use of materials for the first and second layers that were previously unavailable for Hall effect devices due to their relatively weak Hall coefficient. As will be explained in more detail, it is postulated that the confluence and cooperation of the first and second layers cause a reflection or scattering of electron wave functions by the first and second layers, producing a transitional material between the first and second layers that has superior Hall effect properties that are adjustable as a function of the materials chosen for the first and second layers and of the thickness at which they are deposited. Therefore, in a preferred embodiment of the present invention, the first and second layers cooperate at an interface thereof to create a material having the third Hall coefficient.

High Hall coefficients are associated with materials having low charge carrier density. In bismuth, that has been described as a semimetal, a filled-energy band associated with the electrons weakly overlaps an empty band, permitting excitation of a few electrons into a conducting band and leaving a corresponding few holes in the previously-filled energy band. Either the low concentration of electrons or holes can provide high Hall coefficients, but of different sign.

In a preferred embodiment of the present invention, the first layer comprises a material selected from the group consisting of: (1) a conductor, (2) a semiconductor and (3) an insulator. Likewise, the second layer comprises a material selected from the group consisting of: (1) a conductor, (2) a semiconductor and (3) an insulator. Therefore, the Hall effect device of the present invention is not limited to bismuth or any other conductor, for that matter.

In one embodiment of the present invention, the third Hall coefficient is positive. Most metals have a weak negative Hall coefficient. However, some have a positive coefficient. This remained a baffling paradox until it was explained by the quantum theory of electrons in metals, providing a theoretical basis for holes in metal, as described above. The Hall effect device of the present invention can create either positive or negative Hall coefficients and thus take advantage of quantum effects.

In a preferred embodiment of the present invention, the first and second conductive layers are deposited in an elongated strip on the substrate, the elongated strip having a plurality of voltage taps at points along a length thereof. The first and second layers are deposited in desired thicknesses to yield a device of a desired third Hall coefficient.

In a preferred embodiment of the present invention, there are a plurality of interdigitated first and second conductive layers. Thus, the layers are stacked in an alternate fashion to amplify the Hall effect. The plurality of interdigitated layers are believed to provide a large periodic superlattice spacing, contributing to creation of structures providing the above-described low carrier density properties, yielding a material having a band structure similar to bismuth. Impurities in the superlattice contribute to scattering and other effects that complicate the analysis of the band structure.

Of course, it is desirable to obtain voltage measurements from the Hall effect device of the present invention. Accordingly, in a preferred embodiment of the present invention, the Hall effect device further comprises a duality of voltage detection conductors coupled to predetermined points orthogonal to the direction of the bias current on the first and second conductive layers, the duality allowing a measuring of the voltage between the predetermined points of the first and second conductive layers.

In a preferred embodiment of the present invention, the first and second conductive layers are deposited in an elongated strip on the substrate, the elongated strip having a plurality of voltage taps at points along a length thereof and wherein the Hall effect device further comprises voltage detection conductors coupled to each of the voltage taps, the voltage detection conductors allowing a measuring of the voltage across the elongated strip. Thus, while the central elongated strip is deposited, voltage taps of the same material are also deposited. In a more preferred embodiment, the voltage taps are derived from the top and bottom elongated strips in the device comprising the plurality of interdigitated first and second conductive layers.

In a preferred embodiment of the present invention, the first and second conductive layers are deposited in a pattern comprising a bias current conductor and a plurality of probe conductors oriented transversely to the bias current conductor and coupled to the bias current conductor at points along a length thereof and wherein the Hall effect device further comprises voltage detection conductors coupled to ends of the probe conductors distal to the bias current conductor, the voltage detection conductors allowing a measuring of the voltage across the bias current conductor. In the illustrated embodiment, these probe conductors take the form of strips running substantially transverse to the length of the central elongated strip to measure voltages edge-to-edge of the elongated strip for a magnetic field having a flux passing through the surface of the elongated strip.

The present invention further encompasses a method of obtaining a magnetic field map of a magnetic body. The method comprises the steps of: (1) providing a Hall effect device comprising (a) a substrate, (b) a first layer having a first Hall coefficient deposited over the substrate in an elongated strip and (c) a second layer having a second Hall coefficient deposited over the first layer in an elongated strip, the first and second layers cooperating to create, in the Hall effect device, a third Hall coefficient different from the first and second Hall coefficients, (2) causing a bias current to flow in the first and second layers, (3) moving the magnetic body in a direction substantially transverse to a length of the elongated strip of the first and second layers and (4) measuring a voltage between predetermined points of the first and second conductive layers, the voltage indicative of a strength of the magnetic field, to thereby produce the magnetic map of the magnetic body.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that the conception and the specific embodiment disclosed may be readily utilized as a basis for modifying or designing other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENT

Figure 1:
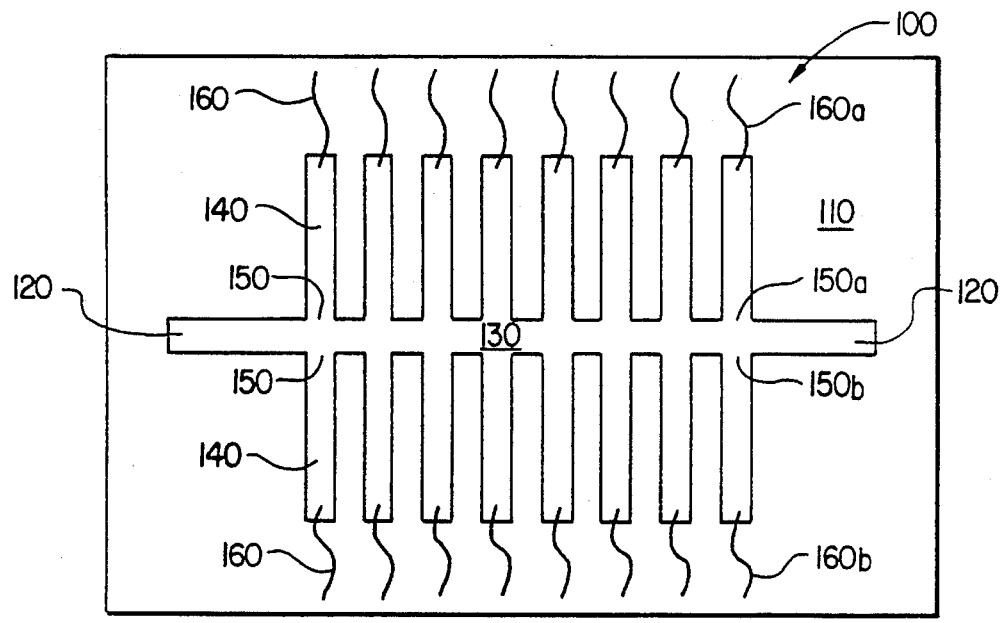
FIG. 1 illustrates a plan view of a thin film Hall effect device of the present invention.

Referring initially to FIG. 1, illustrated is a plan view of a thin film Hall effect device of the present invention. The Hall effect device, generally designated 100, comprises a substrate 110 and first layer and second layers, jointly referenced as 120, deposited over one another and the substrate 110. The first layer has a first Hall coefficient and the second layer has a second Hall coefficient, that may be different in absolute value and sign from the first Hall coefficient. The first and second layers 120 cooperate to create, in the Hall effect device, a third Hall coefficient different from the first and second Hall coefficients. The third Hall coefficient is selectable, depending upon the materials and dimensions selected for the first and second layers 120, but is advantageously far in excess of the first and second Hall coefficients to increase the sensitivity of the device 100 to magnetic fields.

The first and second conductive layers 120 are deposited in a pattern comprising a bias current conductor 130 and a plurality of probe conductors 140 oriented substantially transversely to the bias current conductor 130 and coupled to the bias current conductor 130 at points 150 along a length thereof. Voltage detection conductors 160 coupled to ends of the probe conductors 140 distal to the bias current conductor 130. The voltage detection conductors 160 allow a measuring of the voltage across the width of the bias current conductor 130. When a magnetic field is applied in a direction transverse to the bias current conductor 130, a voltage difference that is a function of the strength of the magnetic field is created along a width of the bias current conductor 130.

The present invention affords the advantage of allowing the probe conductors 140 to be fabricated of the same material as the bias current conductor 130. This simplifies and lowers the cost of manufacture. In the illustrated embodiment, the voltage detection conductors 160 are standard conductors, perhaps composed of copper metal. The voltage detection conductors 160 are adapted to be routed to conventional voltage detection equipment (not shown). For instance, exemplary voltage detection conductors 160a, 160b, forming a pair, are routed to the conventional voltage detection equipment to allow a measurement of the potential difference existing between the two voltage detection conductors 160a, 160b and, hence, the voltage difference existing in the bias current conductor 130 between points 150a, 150b. This measurement yields an indication of the strength of the magnetic field passing through the bias current conductor 130 at the points 150a, 150b.

Figure 2:
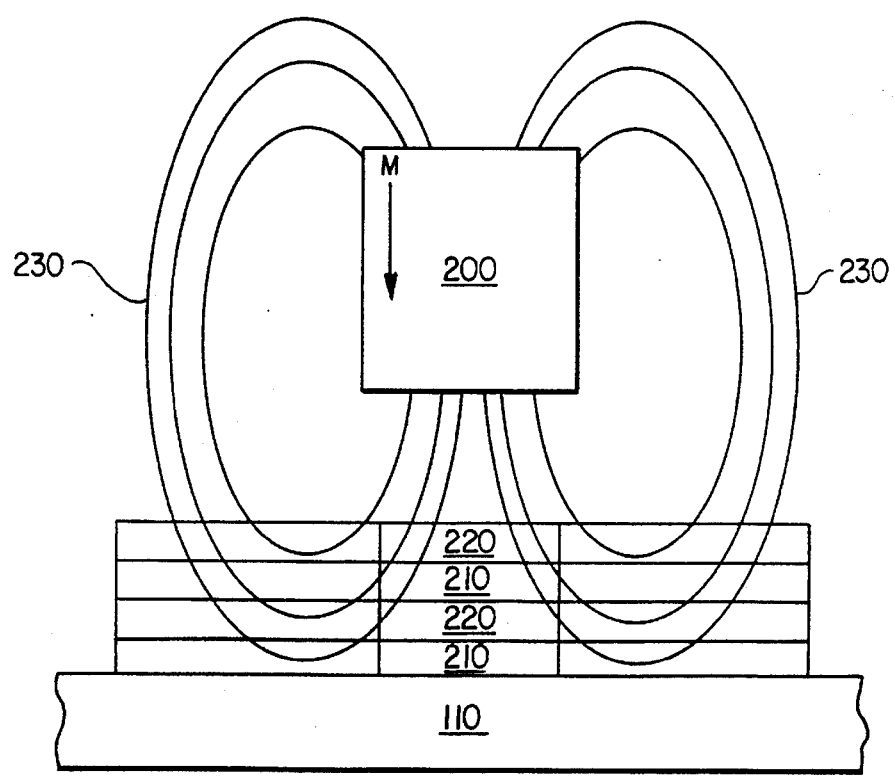
FIG. 2 illustrates an elevational view of the Hall effect device of FIG. 1 and a magnetic body moving with respect to the Hall effect device to create a map of the magnetic field of the magnetic body.

Turning now to FIG. 2, illustrated is an elevational view of the Hall effect device 100 of FIG. 1 and a magnetic body 200 moving with respect to the Hall effect device 100 to create a map of the magnetic field of the magnetic body. As can be clearly seen, the Hall effect device 100 comprises alternating first layers 210 and second layers 220, arranged in an interdigitated fashion. Thus, the layers are stacked in an alternate fashion to amplify the Hall effect of the device 100 as a whole.

The first and second layers 210, 220 are deposited on the substrate by a conventional thin film deposition technique, such as sputtering. For example, the first layer 210 was defined to be tungsten (having a Hall coefficient of about $+1.18 \times 10^4$ cm$^3$/coulomb) and the second layer 220 was defined to be nickel (also having a negligibly small Hall coefficient). The tungsten first layer 210 was deposited in thicknesses of between 5Å and 75Å and the nickel second layer 220 was deposited in thicknesses of between 5Å and 75Å. Conventional sputtering techniques are able to sputter tungsten and nickel at approximately the same yield, so the first and second layers 210,220 were sputtered for approximately the same length of time. The times themselves were simply varied to produce the varied thicknesses.

In one case, at a combined thickness of about 44Å (22Å+22Å) (and stacked in 40 alternating, interdigitated first and second layers 120 to yield a total device thickness of about 880Å), the device 100 was determined by standard techniques to possess a Hall coefficient of about $-80$ cm$^3$/coulomb.

In another case, at a combined thickness of about 28Å (14Å+14Å) (and again stacked in 40 alternating, interdigitated first and second layers 120 to yield a total device thickness of about 560Å), the device 100 was determined to possess a positive Hall coefficient, yielding a positive Hall effect of about +0.5 mV/kG for a 100 mA bias current.

In still another case, at a combined thickness of about 34Å (17Å+17Å) (and yet again stacked in 40 alternating, interdigitated first and second layers 120 to yield a total device thickness of about 680Å), the device 100 was determined to possess negligibly small Hall coefficient. In two of the above cases, the third Hall coefficient is substantially different from the first and second Hall coefficients of the individual first and second layers 210, 220, varying from high positive to high negative to negligible values, depending upon deposition thickness. Thus, in the examples detailed above, multilayering of the two layers 210, 220 cooperated to create a selectable, different and useful third Hall coefficient.

Creation of the third Hall coefficient by cooperation (achieved through multilayering) of the first and second layers 210, 220 allows use of materials for the first and second layers 210, 220 (in this one case, tungsten and nickel) that were previously unavailable for use in Hall effect devices due to their relatively weak Hall coefficient. In a preferred embodiment of the present invention, tungsten and nickel make up the first and second layers 210, 220, respectively.

Those skilled in the art will recognize that useful Hall effect devices may also be constructed using three or more alternating layers of differing materials. The present invention is therefore not limited to the use of only two alternating materials to achieve a selectable Hall coefficient.

As previously mentioned, it is postulated that the confluence and cooperation of the first and second layers 210, 220 produces a transitional material therebetween that has superior Hall effect properties that are adjustable as a function of the materials chosen for the first and second layers 210, 220 and of the thickness at which they are deposited. In fact, the first and second layers 210, 220 apparently cooperate at an interface thereof to create a material having the third Hall coefficient. It is postulated that interdigitated multilayering of the first and second layers 210, 220 enhances the Hall effect of the device 100 as a whole. It is further postulated that this material (a combination of the individual materials of the first and second layers 210, 220) produces a superlattice structure, causing a reflection or scattering of electron wave functions by the first and second layers 210, 220 and yielding a structure having electrical properties that are amenable to the Hall effect. This superlattice may affect the band structure of the interstitial material to reduce charge carrier density to a level acceptable to obtain a relatively high Hall coefficient in a manner similar to the naturally-occurring structure of bismuth as described previously. For a discussion of superlattice structures in general and metallic magnetic superlattices in particular, see, Falicov, *Metallic Magnetic SUperlattices*, Physics Today, October, 1992.

In the above example, the first and second layers 210, 220 are tungsten and nickel, respectively. However, other conductors are within the scope of the invention. The present invention also contemplates that the first and second layers 210, 220 could be semiconductors or insulators. One of the first and second layers 210, 220 must be suited to carry the required bias current.

The individual electrical properties of the materials making up the first and second layers 210, 220 may not be determinative. Rather, it is more the interaction and cooperation of the materials that determine their suitability for application in the present invention.

The magnetic body 200 is shown as moving transverse to the bias current conductor 130. As the magnetic body is moved from left to right as shown, for instance, each longitudinal portion of the bias current conductor 130 is exposed to a normal component of a section of a magnetic field 230 (represented schematically by field lines) of the magnetic body 200. When a bias current is passed through the bias current conductor 130 via conventional means and as each longitudinal portion comes under the influence of the magnetic field 230, each portion responds by creating a measurable voltage potential. This voltage potential, that changes over time as the magnetic body 200 passes over the bias current conductor 130 and that may vary as a function of the particular longitudinal portion measured, is used to create a magnetic map of the magnetic body.

Figure 3:
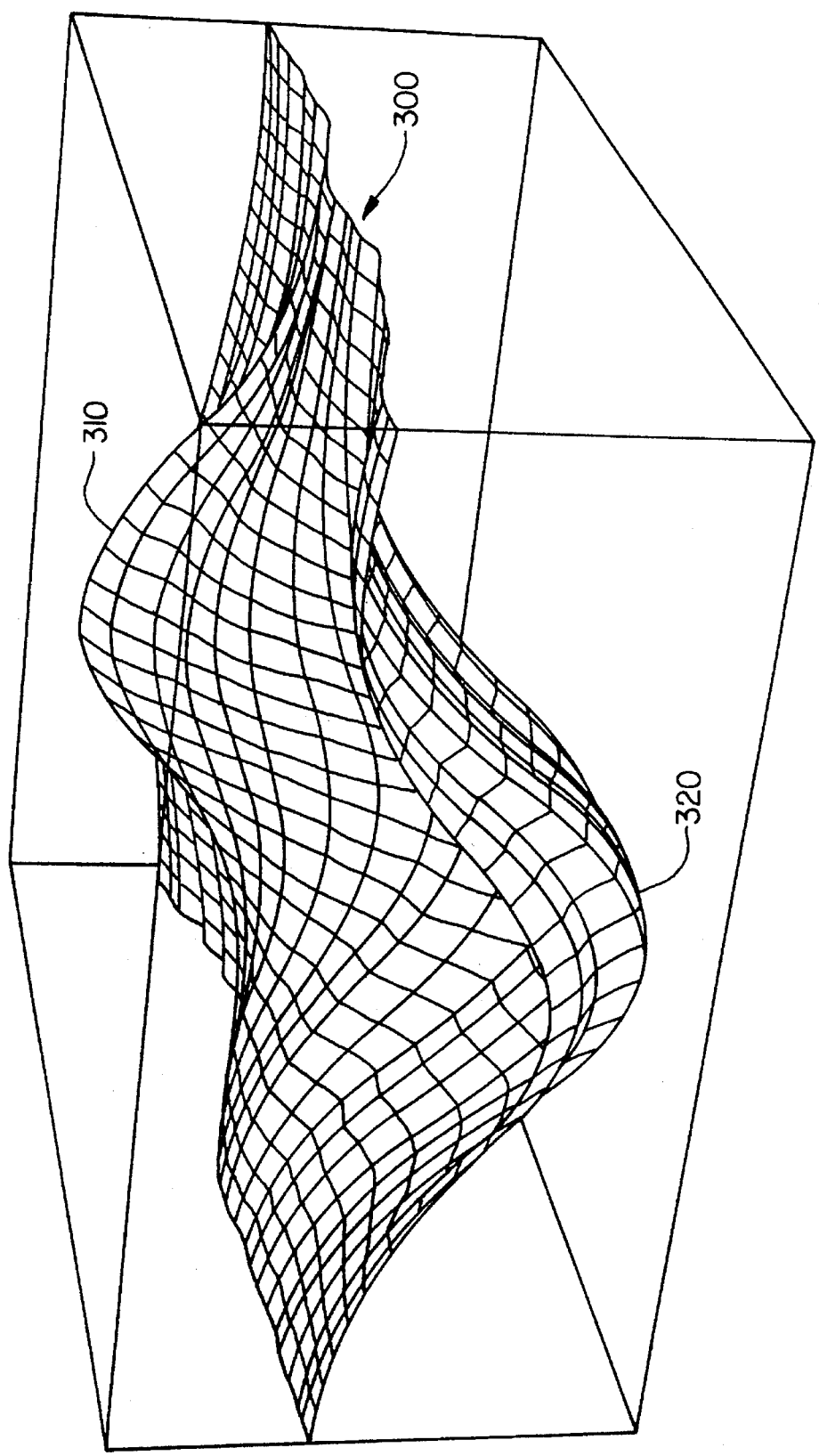
FIG. 3 illustrates a view of a three dimensional map of a magnetic field produced by the method of the present invention.

Turning now to FIG. 3, illustrated is a view of the magnetic map produced by the method of the present invention. The map, generally designated 300, contains a three-dimensional indication of magnetic field strength of the magnetic body 200 and a second magnetic body as a function of location near the magnetic bodies. It is apparent from the map 300 that opposite poles of the magnetic bodies are proximate the Hall effect sensors. The map 300 gives an indication of voltage proportional to the field on the vertical axis as a function of position in the plane scanned.

More specifically, FIG. 3 is a computer-generated representation of raw data taken with a single scan of a linear array of thirty vertically oriented Hall effect sensors fabricated of a multilayer film in accordance with the present invention and separated a distance of 3mm from the magnetic bodies. The magnetic bodies were moved, in this case, in 0.7mm increments. Each sensor scans a path 0.7mm wide. Therefore, each sensor produces a pixel area of approximately 0.7mm×0.7mm for a given period of time, yielding a total side-to-side scan area for the map 300 of approximately 2.1cm×2.1cm. The data have not been smoothed to eliminate jagged edges arising from discrete values. Nor have the data been scaled for varying Hall coefficients among the thirty sensors. For practical purposes, the thirty sensors may be regarded as having substantially the same Hall coefficient.

The magnetic body 200 is a magnetized disk 3mm thick and 8mm in diameter and is represented as a hill 310 in the map 300. The second magnetic body is 3mm thick and 10mm in diameter and is represented as a valley 320 in the map 300.

The map 300 represents peak magnetic fields of appoximately 1200 gauss. Those of skill in the art will recognize minor artifacts in the map 300. These artifacts are largely due to magnetic hysteresis and should be removable as material, electronic circuit and scanning techniques improve.

From the above, it is apparent that the present invention provides a Hall effect device and a method of obtaining a magnetic field map of a magnetic body with the Hall effect device. The device comprises: (1) a substrate, (2) a first layer having a first Hall coefficient deposited over the substrate and (3) a second layer having a second Hall coefficient deposited over the first layer, the first and second layers cooperating to create, in the Hall effect device, a third Hall coefficient different from the first and second Hall coefficients.

Although the present invention and its advantages have been described in detail, it should be understood that various changes, substitutions and alterations can be made herein without departing from the spirit and scope of the invention as defined by the appended claims.

I claim:

1. A Hall effect device, comprising:

a substrate;

a first layer having a first Hall coefficient deposited over said substrate; and a second layer having a second Hall coefficient deposited over said first layer, said first and second layers cooperating to create, in said Hall effect device, a third Hall coefficient different from said first and second Hall coefficients.

2. The Hall effect device as recited in claim 1 wherein said first layer comprises a material selected from the group consisting of:

a conductor;

a semiconductor; and an insulator.

3. The Hall effect device as recited in claim 1 wherein said second layer comprises a material selected from the group consisting of:

a conductor;

a semiconductor; and an insulator.

4. The Hall effect device as recited in claim 1 wherein said third Hall coefficient is positive.

5. The Hall effect device as recited in claim 1 wherein said first and second layers cooperate at an interface thereof to create a material having said third Hall coefficient.

6. The Hall effect device as recited in claim 1 wherein said first and second conductive layers are deposited in an elongated strip on said substrate, said elongated strip having a plurality of voltage taps at points along a length thereof.

7. The Hall effect device as recited in claim 1 further comprising a plurality of interdigitated first and second conductive layers.

8. The Hall effect device as recited in claim 1 further comprising a duality of voltage detection conductors coupled to predetermined points on said first and second conductive layers, said duality allowing a measuring of said voltage between said predetermined points of said first and second conductive layers.

9. The Hall effect device as recited in claim 1 wherein said first and second conductive layers are deposited in an elongated strip on said substrate, said elongated strip having a plurality of voltage taps at points along a length thereof and wherein said Hall effect device further comprises voltage detection conductors coupled to each of said voltage taps, said voltage detection conductors allowing a measuring of said voltage across said elongated strip.

10. The Hall effect device as recited in claim 1 wherein said first and second conductive layers are deposited in a pattern comprising a bias current conductor and a plurality of probe conductors oriented transversely to said bias current conductor and coupled to said bias current conductor at points along a length thereof and wherein said Hall effect device further comprises voltage detection conductors coupled to ends of said probe conductors distal to said bias current conductor, said voltage detection conductors allowing a measuring of said voltage across said bias current conductor.

11. A method of obtaining a magnetic field map of a magnetic body, comprising the steps of:

providing a Hall effect device, comprising:

a substrate, a first layer having a first Hall coefficient deposited over said substrate in an elongated strip, and a second layer having a second Hall coefficient deposited over said first layer in an elongated strip, said first and second layers cooperating to create, in said Hall effect device, a third Hall coefficient different from said first and second Hall coefficients;

causing a bias current to flow in said first and second layers;

moving said magnetic body in a direction substantially transverse to a length of said elongated strip of said first and second layers; and measuring a voltage between predetermined points of said first and second conductive layers, said voltage indicative of a strength of said magnetic field, to thereby produce said magnetic map of said magnetic body.

12. The method as recited in claim 11 wherein said step of providing comprises the step of providing a first layer comprising a material selected from the group consisting of:

a conductor;

a semiconductor; and an insulator.

13. The method as recited in claim 11 wherein said step of providing comprises the step of providing a second layer comprising a material selected from the group consisting of:

a conductor;

a semiconductor; and an insulator.

14. The method as recited in claim 11, wherein said step of providing comprises the step of providing first and second layers that cooperate to create said positive third Hall coefficient.

15. The method as recited in claim 11 wherein said step of providing comprises the step of providing first and second layers that cooperate at an interface thereof to create a material having said third Hall coefficient.

16. The method as recited in claim 11 wherein said step of providing comprises the step of providing a plurality of interdigitated first and second conductive layers.

17. The method as recited in claim 11 wherein said step of measuring is repeated over time to produce said magnetic map that indicates a variation of said magnetic field as a function of a position of said magnetic body with respect to said elongated strip of said first and second layers.

18. The method as recited in claim 11 wherein said step of providing comprises the step of providing a duality of voltage detection conductors coupled to predetermined points on said first and second conductive layers, said duality allowing a measuring of said voltage between said predetermined points of said first and second conductive layers.

19. The method as recited in claim 11 wherein said step of providing comprises the steps of:

providing said elongated strip with a plurality of voltage taps at points along a length thereof; and coupling voltage detection conductors to each of said voltage taps, said voltage detection conductors allowing a measuring of said voltage across said elongated strip.

20. The method as recited in claim 11 wherein said step of providing comprises the steps of:

depositing said first and second conductive layers in a pattern comprising a bias current conductor and a plurality of probe conductors oriented transversely to said bias current conductor and coupled to said bias current conductor at points along a length thereof; and coupling voltage detection conductors to ends of said probe conductors distal to said bias current conductor, said voltage detection conductors allowing a measuring of said voltage across said bias current conductor.

* * * * *